(12) United States Patent
Rainish et al.

(10) Patent No.: US 11,595,061 B2
(45) Date of Patent: *Feb. 28, 2023

(54) METHODS AND DEVICES FOR OPERATING IN BEAM HOPPING CONFIGURATION AND UNDER A RANGE OF SIGNAL TO NOISE RATIO CONDITIONS

(71) Applicant: SatixFy Israel Ltd., Rehovot (IL)

(72) Inventors: Doron Rainish, Ramat Gan (IL); Avraham Freedman, Tel Aviv (IL)

(73) Assignee: SatixFy Israel Ltd., Rehovot (IL)

(*) Notice: Subject to any disclaimer, the term of this patent is extended or adjusted under 35 U.S.C. 154(b) by 45 days.

This patent is subject to a terminal disclaimer.

(21) Appl. No.: 16/904,738

(22) Filed: Jun. 18, 2020

(65) Prior Publication Data

US 2020/0389189 A1 Dec. 10, 2020

Related U.S. Application Data

(63) Continuation of application No. 16/693,311, filed on Nov. 24, 2019, now Pat. No. 10,707,904.

(60) Provisional application No. 62/842,086, filed on May 2, 2019.

(51) Int. Cl.
| | |
|---|---|
| *H03M 13/00* | (2006.01) |
| *H03M 13/29* | (2006.01) |
| *H03M 13/45* | (2006.01) |
| *H04B 7/185* | (2006.01) |
| *H04L 5/00* | (2006.01) |
| *H04W 56/00* | (2009.01) |
| *H04L 1/00* | (2006.01) |
| *H04B 7/212* | (2006.01) |

(52) U.S. Cl.
CPC ...... *H03M 13/2924* (2013.01); *H03M 13/453* (2013.01); *H04B 7/18513* (2013.01); *H04B 7/2125* (2013.01); *H04L 1/0005* (2013.01); *H04L 5/006* (2013.01); *H04W 56/003* (2013.01)

(58) Field of Classification Search
CPC ............ H03M 13/2924; H03M 13/453; H04B 7/18513; H04B 7/2125; H04W 56/003; H04L 5/006; H04L 1/0005
USPC ......................................... 714/756, 776, 777
See application file for complete search history.

(56) References Cited

U.S. PATENT DOCUMENTS

| | | | | |
|---|---|---|---|---|
| 6,411,452 | B1* | 6/2002 | Cloke | G11B 20/10009 |
| 6,473,878 | B1* | 10/2002 | Wei | H03M 13/2703 |
| | | | | 714/755 |
| 7,675,979 | B1* | 3/2010 | Yu | H04L 1/0072 |
| | | | | 375/259 |
| 8,693,563 | B2* | 4/2014 | Hwang | H04L 1/0625 |
| | | | | 375/267 |
| 9,991,946 | B2* | 6/2018 | Amundsen | H04B 7/18589 |
| 10,707,904 | B1* | 7/2020 | Rainish | H04L 1/001 |
| 2006/0013185 | A1* | 1/2006 | Seo | H04W 36/30 |
| | | | | 370/208 |
| 2010/0128660 | A1* | 5/2010 | Becker | H04L 1/0025 |
| | | | | 370/316 |

(Continued)

*Primary Examiner* — Albert Decady
*Assistant Examiner* — Osman M Alshack
(74) *Attorney, Agent, or Firm* — Mark M. Friedman

(57) ABSTRACT

Methods and transceivers transmit communication frames that comprise a sequence of N symbols, ensuing payload header symbols, and ensuing payload message symbols. The sequence of N symbols encodes information according to signal-to-noise ratio associated with the communication frame.

17 Claims, 10 Drawing Sheets

(56) References Cited

U.S. PATENT DOCUMENTS

| | | | |
|---|---|---|---|
| 2012/0327871 A1* | 12/2012 | Ghosh | H04L 1/0025 370/329 |
| 2014/0040705 A1* | 2/2014 | Yen | H04L 1/0068 714/776 |
| 2014/0153654 A1* | 6/2014 | Vojcic | H04N 21/4382 375/240.28 |
| 2016/0219506 A1* | 7/2016 | Pratt | H04L 27/0008 |
| 2016/0249355 A1* | 8/2016 | Chae | H04W 72/0446 |
| 2017/0041932 A1* | 2/2017 | Chae | H04W 72/0446 |
| 2017/0141906 A1* | 5/2017 | Rainish | H04B 7/1851 |
| 2018/0212715 A1* | 7/2018 | Rainish | H04L 1/0007 |
| 2019/0181983 A1* | 6/2019 | Ye | H04L 1/0013 |

\* cited by examiner

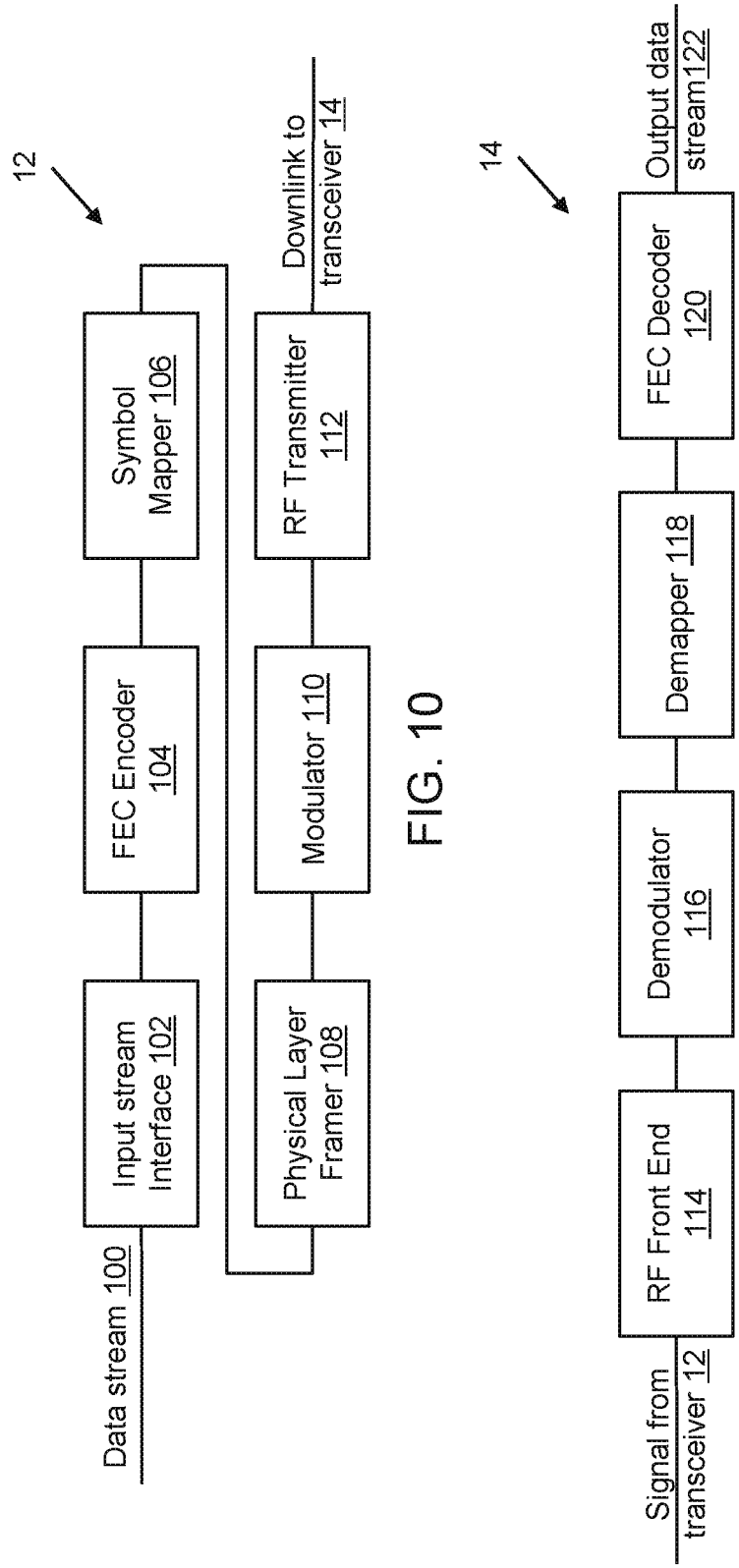

METHODS AND DEVICES FOR OPERATING IN BEAM HOPPING CONFIGURATION AND UNDER A RANGE OF SIGNAL TO NOISE RATIO CONDITIONS

CROSS-REFERENCE TO RELATED APPLICATIONS

This application claims priority from U.S. Provisional Patent Application No. 62/842,086, filed May 2, 2019, whose disclosure is incorporated by reference in its entirety herein.

TECHNICAL FIELD

The present invention relates to communications systems and in particular communications exchanged in satellite communications networks.

BACKGROUND OF THE INVENTION

Communication satellites enable communication via links that extend over a long range and have wide area coverage, and provide solutions for various applications, including, for example, broadcasting, video transmission, and digital telephony.

Beam hopping techniques have been shown to increase the efficiency of satellite transmission while simultaneously adapting the resources of the satellite to the actual demand of ground terminals. In beam hopping, the satellite transmission time is partitioned between different beams, each illuminating a different respective area (or cell) on the ground. Beam hopping is applicable for various satellite configurations, including, for example, high throughput satellites that support a high number of beams from a single satellite, and low earth orbit (LEO) satellite constellations that support a high number of beams from multiple LEO satellites. Waveforms that support beam hopping have also been specified for use in the Digital Video Broadcasting—Satellite—Second Generation Extensions (DVB-S2X) standard, which provides efficient packetized data transmission, used for example in broadcast television services.

One major drawback in beam hopping is that the downlink signal from the satellite is not a continuous signal, but is in fact rather bursty. In situations in which the downlink hop times are not pre-scheduled but are rather traffic driven, the receiver requires a long preamble—i.e., header—to be able to acquire and synchronize to the signal. This is further exacerbated when the signal is received at very low signal-to-noise ratio (VLSNR), which in the DVB-S2X standard is nominally down to −10 dB. For such receivers, the transmitting satellite typically must use a very low code rate and a high degree of spreading to ensure proper signal acquisition and decoding at the receiver. The low code rate and high spreading reduces the bandwidth of the downlink signal, resulting in low data rate on the downlink.

SUMMARY OF THE INVENTION

The present invention is directed to methods and devices for communicating under a wide range of SNR conditions, including very low SNR conditions.

Embodiments of the present invention are directed to a method for communicating in one or more links of a communication network. The method comprises: transmitting a communication frame comprising a sequence of N symbols, ensuing payload header symbols, and ensuing payload message symbols, the sequence of N symbols encoding information in accordance with signal-to-noise ratio (SNR) associated with the communication frame.

Optionally, the encoded information is indicative of a number of the payload header symbols necessary to decode a corresponding number of the payload message symbols.

Optionally, the one or more links includes at least one transceiver implemented as part of a satellite.

Optionally, the communication frame includes a superframe header consisting of extended header field symbols and protection level indication symbols, and the sequence of N symbols is included in the protection level indication symbols.

Optionally, the communication frame includes a superframe header consisting of L symbols that consists of a first segment of L-N symbols and a second segment of N symbols, and the encoded information is included in the second segment of symbols.

Optionally, L is 720, and N is 216.

Optionally, the encoded information includes a mapping of a plurality of SNR ranges to a corresponding number of payload header symbols.

Optionally, the plurality of SNR ranges includes exactly four SNR ranges, and a first SNR range of the plurality of SNR ranges is mapped to a first number of payload header symbols obtained by repeating a block of payload header symbols five times, and a second SNR range of the plurality of SNR ranges is mapped to a second number of payload header symbols obtained by repeating the block of payload header symbols twice, and a third SNR range of the plurality of SNR ranges is mapped to a third number of payload header symbols obtained by repeating the block of payload header symbols once, and a fourth SNR range of the plurality of SNR ranges is mapped to a fourth number of payload header symbols obtained by puncturing the block of payload header symbols.

Optionally, the information encoded in the sequence of N symbols consists of two bits of information.

Optionally, the sequence of N symbols is selected from a set of four possible sequences of length N.

Optionally, the set of four possible sequences of length N are selected such that the minimum Hamming distance of the four possible sequence of length N is maximized.

Optionally, the symbols for each of the four sequences are selected from a binary symbol alphabet consisting of a first symbol value and a second symbol value, and a first sequence of the four possible sequences consists of N symbols of the first symbol value, and a second sequence of the four possible sequences consists of N/3 symbols of the first symbol value followed by 2N/3 symbols of the second symbol value, and a third sequence of the four possible sequences consists of 2N/3 symbols of the second symbol value followed by N/3 symbols of the first symbol value, and a fourth sequence of the four possible sequences consists of N/3 symbols of the second symbol value followed by N/3 symbols of the first symbol value followed by N/3 symbols of the second symbol value.

Optionally, the method further comprises: generating the four possible sequences of length N.

Optionally, the communication frame is a superframe compliant with Digital Video Broadcasting—Satellite—Second Generation Extensions (DVB-S2X) standard.

Embodiments of the present invention are directed to a communication system. The communication system comprises: a transceiver configured to transmit a communication frame comprising a sequence of N symbols, ensuing payload header symbols, and ensuing payload message symbols, the sequence of N symbols encoding information in accordance with signal-to-noise ratio (SNR) associated with the communication frame.

Optionally, the encoded information is indicative of a number of the payload header symbols necessary to decode a corresponding number of the payload message symbols.

Optionally, the transceiver is implemented in a satellite.

Embodiments of the present invention are directed to a method for communicating in one or more links of a communication network. The method comprises: transmitting a communication frame that comprises a header including a sequence of N symbols, and one or more ensuing communication sub-frames, each communication sub-frame including a plurality of repeated blocks of payload header symbols followed by blocks of payload message symbols, the sequence of N symbols encoding information in accordance with signal-to-noise ratio (SNR) associated with the communication frame and indicative of a repetition factor to be applied to the blocks of payload header symbols, in each communication sub-frame, necessary to decode a corresponding number of the blocks of the payload message symbols.

Embodiments of the present invention are directed to a communication system. The communication system comprises: a transceiver configured to transmit a communication frame that comprises a header including a sequence of N symbols, and one or more ensuing communication sub-frames, each communication sub-frame including a plurality of repeated blocks of payload header symbols followed by blocks of payload message symbols, the sequence of N symbols encoding information in accordance with signal-to-noise ratio (SNR) associated with the communication frame and indicative of a repetition factor to be applied to the blocks of payload header symbols, in each communication sub-frame, necessary to decode a corresponding number of the blocks of the payload message symbols.

Embodiments of the present invention are directed to a method for communicating in one or more links of a communication network. The method comprises: receiving a communication frame comprising a sequence of N symbols, ensuing payload header symbols, and ensuing payload message symbols, the sequence of N symbols encoding information in accordance with signal-to-noise ratio (SNR) associated with the communication frame.

Optionally, the encoded information is indicative of a number of the payload header symbols necessary to decode a corresponding number of the payload message symbols.

Embodiments of the present invention are directed to a communication system. The communication system comprises: a transceiver configured to receive a communication frame comprising a sequence of N symbols, ensuing payload header symbols, and ensuing payload message symbols, the sequence of N symbols encoding information in accordance with signal-to-noise ratio (SNR) associated with the communication frame.

Embodiments of the present invention are directed to a method for communicating in one or more links of a communication network. The method comprises: transmitting a communication frame comprising a sequence of N symbols, ensuing payload header symbols, and ensuing payload message symbols, the sequence of N symbols encoding information in accordance with signal-to-noise ratio (SNR) associated with the communication frame, the encoded information is indicative of a number of the payload header symbols necessary to decode a corresponding number of the payload message symbols, the sequence of N symbols is selected from a set of four possible sequences of length N, and the set of four possible sequences of length N are selected such that the minimum Hamming distance of the four possible sequence of length N is maximized.

Embodiments of the present invention are directed to a communication system. The communication system comprises: a transceiver configured to transmit a communication frame comprising a sequence of N symbols, ensuing payload header symbols, and ensuing payload message symbols, the sequence of N symbols encoding information in accordance with signal-to-noise ratio (SNR) associated with the communication frame, the encoded information is indicative of a number of the payload header symbols necessary to decode a corresponding number of the payload message symbols, the sequence of N symbols is selected from a set of four possible sequences of length N, and the set of four possible sequences of length N are selected such that the minimum Hamming distance of the four possible sequence of length N is maximized.

Within the context of this document, the term "transceiver" generally refers to a device that encompasses the following options: a device used for transmission only, a device used for reception only, and a device used for both transmission and reception. All of these options are covered by the term "transceiver", and the applicable option may depend on the specific implementation of the network configuration that is made up of one or more such transceivers. Furthermore, each such transceiver includes components that are configured to perform tasks or actions that are part of transmission and/or reception functionality (depending on the applicable option of transceiver type). Such components are well understood by those of ordinary skill in the art, and include, but are not limited to, signal acquisition modules, tuners, local oscillators, frequency filters (e.g., bandpass filters, low pass filters, etc.), analog-to-digital conversion (ADC) and digital-to-analog conversion (DAC) modules, modulators, demodulators, bit-to-symbol mappers and demappers, video (e.g., MPEG) encoders, video decoders, forward error correction (FEC) encoders, FEC decoders, digital signal processing modules, automatic gain controllers, timing recovery modules, phase-locked loops, equalization modules, I/Q balancers, and antennas.

The interchangeable terms "dwell" and "communication dwell", as used herein, generally refer to a duration limited waveform signal, generated by modulating information for transmission over a communication medium (i.e., communication channel). The duration limited signal is one of many time-partitioned segments of a downlink transmission from one transceiver (e.g., implemented as a satellite) to one or more other transceivers (e.g., ground-based terminals), wherein the transmitting and receiving transceivers form one or more communication links of a communication network. The information that is modulated may include payload data as well as information required for proper operation of the communication link(s), including, for example, synchronization and header data.

The term "communication frame", as used herein, generally refers to one or more time-segments of a "dwell" that comprises "symbols". In other words, each dwell may be formed from one or more communication frames, as will be discussed in further detail in subsequent sections of the present disclosure. The communication frame may be, for example, a Standard compliant frame (i.e., defined by a communication protocol, such as, for example, the Digital Video Broadcasting—Satellite—Second Generation Extensions (DVB-S2X) standard). The term "symbol", as used herein, is used to denote a segment of time of a communication frame, in which the waveform is generated according to a set of bits.

Unless otherwise defined herein, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Attention is now directed to the drawings, where like reference numerals or characters indicate corresponding or like components. In the drawings:

FIG. 10 is a simplified block diagram of a transmitting transceiver, according to an embodiment of the present invention; and FIG. 11 is a simplified block diagram of a receiving transceiver, according to an embodiment of the present invention.

DESCRIPTION OF THE PREFERRED EMBODIMENTS

Figure 1:
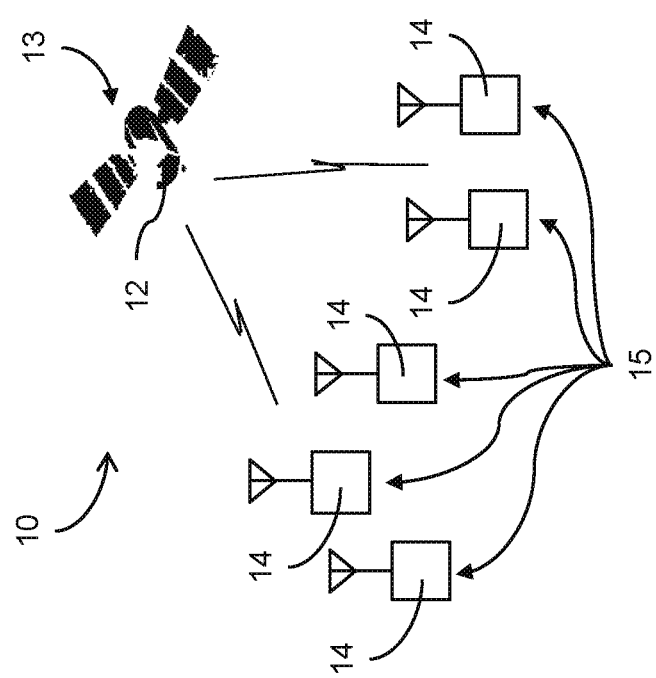
FIG. 1 is a schematic representation of a communication network, exemplarily illustrated as a satellite communication network, in which embodiments of the present invention can be performed.

The present invention is directed to methods and devices for communicating under low SNR conditions.

The present invention is applicable to communication networks in which communications are exchanged under limited SNR conditions, and is of particular value when applied to satellite communication networks employing beam hopping techniques.

Before explaining at least one embodiment of the invention in detail, it is to be understood that the invention is not necessarily limited in its application to the details of construction and the arrangement of the components and/or methods set forth in the following description and/or illustrated in the drawings and/or the examples. The invention is capable of other embodiments or of being practiced or carried out in various ways.

Referring now to the drawings, FIG. 1 shows a communications network (referred to interchangeably as a communications system) 10, for example a satellite communications network, in which embodiments of the present disclosure can be performed. Generally speaking, the communications network 10 includes a first transceiver 12 which exchanges communications with one or more second transceivers 14. In a particularly preferred but non-limiting implementation, as illustrated in FIG. 1, the first transceiver 12 is deployed as part of a space-based satellite 13, which can be a relay satellite between two terminals (which can be ground terminals or other satellites), and the second transceivers 14 are deployed as part of respective terminals 15. In such an implementation, the communication network 10 preferably utilizes beam hopping techniques to exchange communications between the transceivers 12, 14, and the signal transmitted by the satellite in each hop is an aggregation of all of the signals designated for the terminals in the cell covered by that hop. The second transceivers 14 can be implemented in various ways, including, but not limited to, system on chip (SoC) solutions such as, for example, application specific integrated circuits (ASICs).

Beam hopping techniques in satellite communication networks are well known in the art, and the specifics of beam hopping will only be repeated herein in order to provide enough detail necessary to properly contextualize the communication exchange techniques of the present invention. When implemented as a satellite communication network, the space-based satellite 13 may be a standalone high throughput satellite (HTS) that supports multiple downlink beams on the ground, or may be a part of a constellation of satellites configured to provide continuous on-demand communication services to the terminals 15. Therefore, the embodiments of the present invention are applicable to various types of satellite systems, including, but not limited to, low earth orbit (LEO) satellite systems, medium earth orbit (MEO) satellite systems, and geostationary orbit—i.e., geosynchronous equatorial orbit (GEO)—satellite systems.

Bearing the above in mind, when utilizing beam hopping, the first transceiver 12 partitions the downlink transmission into multiple non-overlapping transmission dwells, with each dwell corresponding to a different beam hop. This allows the communication network 10 to operate with higher efficiency whereby the resources of the first transceiver 12 are adapted to the actual demand of the receiving transceivers 14 by allocating longer transmission times for more densely populated cells, and shorter transmission times to sparsely populated cells.

Figure 2B:
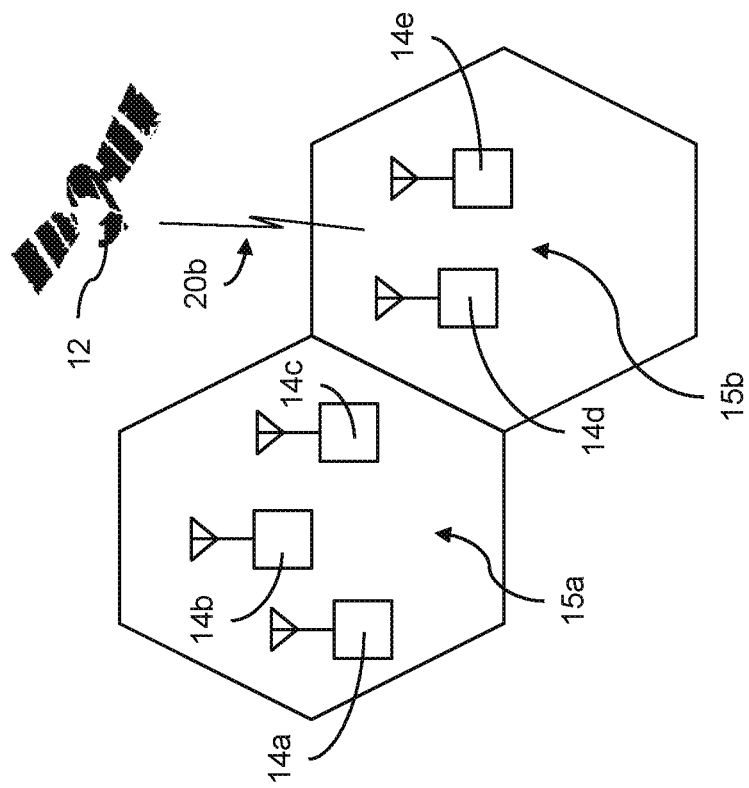
FIG. 2B is a schematic representation of the satellite communication network of FIGS. 1 and 2A, in which the satellite transmits to a second group of terminals in a second hop.
Figure 2A:
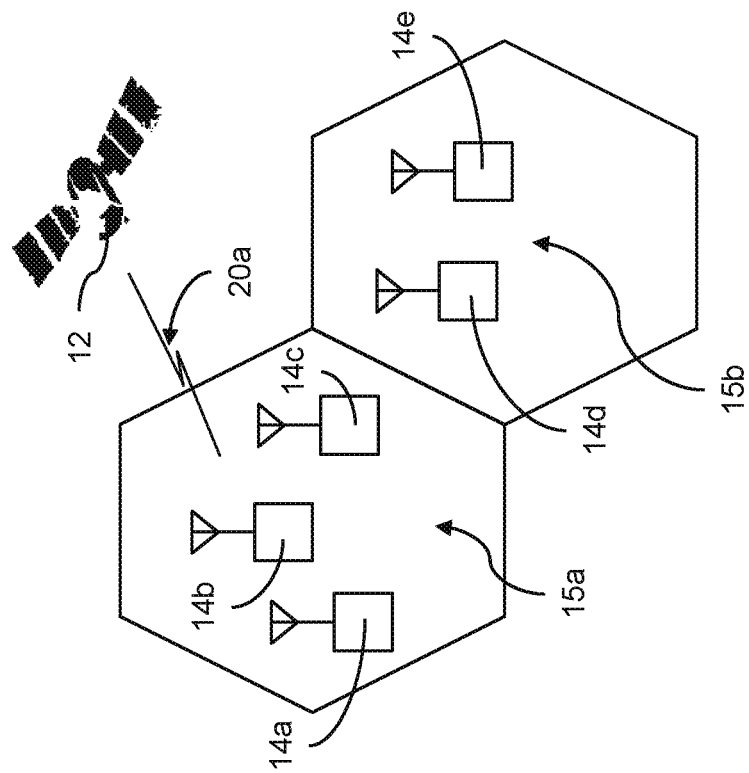
FIG. 2A is a schematic representation of the satellite communication network of FIG. 1, in which a satellite transmits to a first group of terminals in a first hop.

FIG. 2A shows a first beam hop, in which the first transceiver 12 transmits to a first group of terminals 15a, that includes transceivers 14a, 14b, 14c, in a first dwell 20a. The first group of terminals 15a are located within a first cell (i.e., geographical footprint area) on the ground that is illuminated by the downlink beam of that beam hop.

FIG. 2B shows a second beam hop, in which the first transceiver 12 transmits to a second group of terminals 15a, that includes transceivers 14d, 14e, in a second dwell 20b. The second group of terminals 15b are located within a second cell on the ground that is illuminated by the downlink beam of that beam hop. The cells are typically non-overlapping areas, the size of which may be dependent on the orbit type of the transmitting satellite and/or the downlink beam parameters. For example, for GEO satellites, the cell radius is typically on the order of 100 kilometers. For LEO satellites, however, the cell radius depends on the orbit altitude of the satellite as well as the downlink beamwidth.

Although only two hops (dwells) are shown in FIGS. 2A and 2B, it should be generally understood that downlink transmission via multiple dwells can continue as needed to meet the demands of the transceivers in the communication network. For example, additional communications can be exchanged between the first transceiver 12 and the transceivers 14a-c in the first group of terminals 15a in subsequent dwells, and similarly between the first transceiver 12 and the transceivers 14d, 14e in the second group of terminals 15b in other subsequent dwells. Furthermore, it should be apparent that downlink transmission via multiple dwells can cover a large number of cells, typically orders of magnitude greater than the two cells illustrated in the drawings.

As will be discussed in further detail below, the information transmitted in each dwell may include information that is intended to be received by one, some, or all of the transceivers 14 in the corresponding cell.

Figure 3:
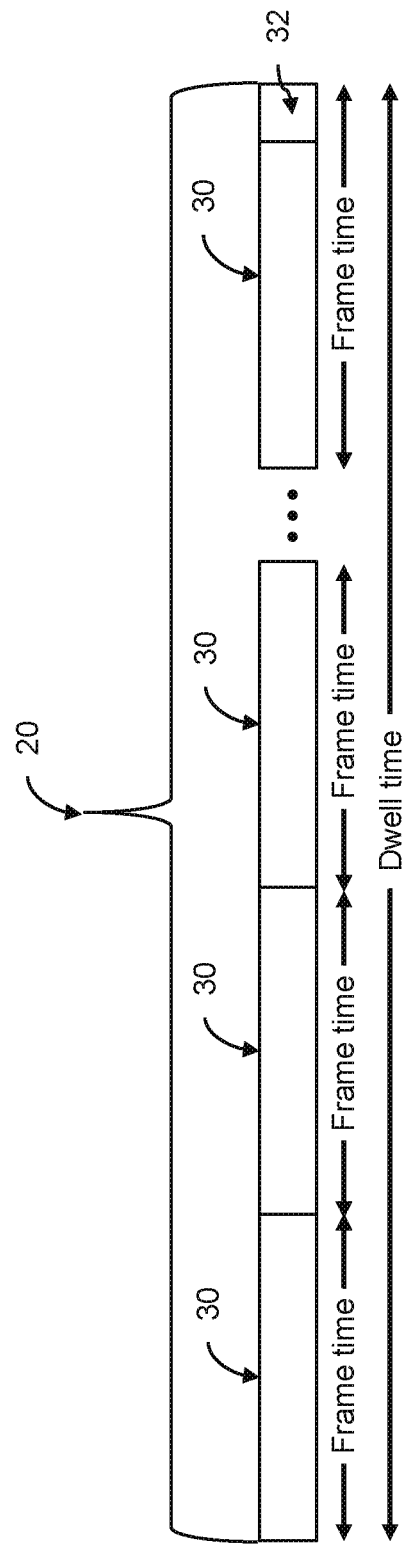
FIG. 3 is an exemplary dwell that is made up of multiple communication frames, according to an embodiment of the present invention.

Refer now to FIG. 3, the general format of an exemplary dwell 20 according to a preferred but non-limiting embodiment of the disclosed subject matter. Each dwell 20 is formed from multiple communication frames 30, which in the context of a Standard compliant frame used in the DVB-S2X standard is referred to interchangeably as a "superframe" or "communication superframe". The communication frames 30 in each dwell 20 are nearly identical to each other in structure, with the exception that the last communication frame 30 in the dwell 20 includes a postamble 32 of payload header symbols to accommodate beam switching time—i.e., time to allow the first transceiver 12 to switch to the next beam hop. Note that the dwell times for individual dwells may be different, depending on the transmission demands of the receiving transceivers 14. The frame times of the individual communication frames 30 within a single dwell 20 may also be different.

Figure 4:
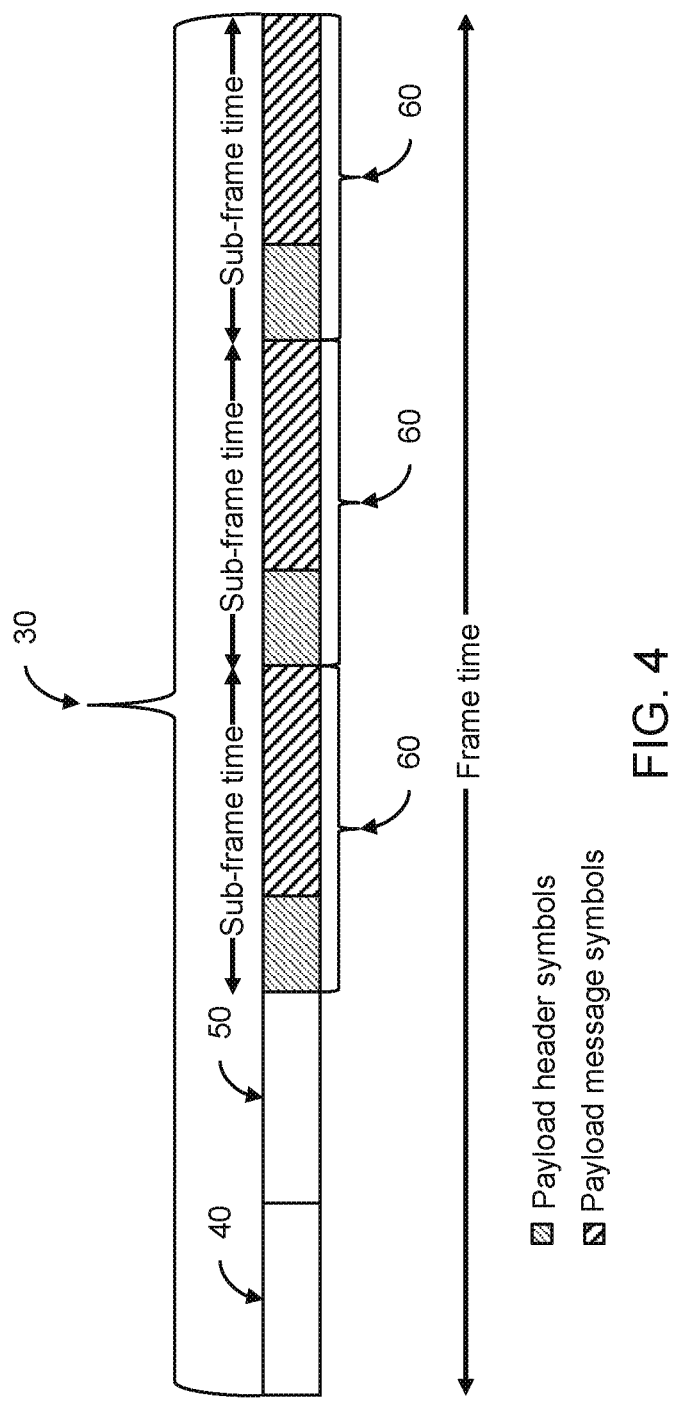
FIG. 4 is an exemplary communication frame of the dwell of FIG. 3, according to an embodiment of the present invention.

With continued reference to FIG. 3, refer now to FIG. 4, an exemplary communication frame 30 of a dwell 20 according to a preferred but non-limiting embodiment of the disclosed subject matter. The communication frame 30 shown in FIG. 4 is a Standard compliant frame used in the DVB-S2X standard. The communication frame 30 consists of the following segments of symbols: a preamble 40, a communication frame header (within this context referred to interchangeably as a superframe header) 50, and an ensuing sequence of communication sub-frames 60 (referred to as sub-frames). Each of the sub-frames 60 consists of payload symbols that consists of ensuing payload header symbols and corresponding ensuing payload message symbols. A set of P known pilot symbols (P is 36 symbols in most of the cases described in the DVB-S2X standard) are embedded within the overall symbol stream of the communication frame 30 every T symbols, which is 1440 symbols in most of the cases described in the DVB-S2X standard.

Each communication frame 30 utilizes two-level encapsulation for encapsulating payload information, as will now be described. The payload symbols of a given sub-frame 60 are encapsulated in the sub-frame 60 as payload symbols consisting of a payload header and a payload message (i.e., the data that is to be transmitted to the terminal(s)). Each sub-frame 60 carries either 64,800 payload message bits or 16,200 payload message bits. The payload message bits are encoded (error-correction encoded) and M-ary modulated according to a modulation and encoding format (MOD-COD), and the encoded and modulated payload message is carried by ceiling($64,800/\log_2 M$) or ceiling($16,200/\log_2 M$) payload message symbols, where the function ceiling(x) defines the smallest integer, greater than or equal to x. In the DVB-S2X standard, M can be 4, 8, 16, 32, 64, 128 or 256, and the number of payload message symbols is always an integer multiple of K (extra symbols are added as padding if this criterion is not met). As such, the payload message symbols of a given sub-frame 60 are encapsulated in blocks of K symbols (each K symbol block is referred to interchangeably as a capacity unit). In the DVB-S2X standard, K is equal to 90.

The payload header carries approximately 16 bits of information, and these bits are encoded differently than the payload message bits, and are BPSK modulated to generate payload header symbols. The payload header symbols carry information pertaining to various parameters of the sub-frame 60 that concern its demodulation, decoding, and general structure thereof, which makes it possible for the receiving transceiver(s) 14 to operate on the received sub-frames 60. Each sub-frame 60 in the communication frame 30 may be transmitted by the first transceiver 12 to a different respective receiving transceiver 14, and at a different MODCOD (which is specified by the payload header symbols of the specific sub-frame 60).

Traditionally, the payload header is designed in a way which enables detection of the payload header under SNR conditions even lower than that which is required to decode the payload message symbols. In order to provide similar capability under VLSNR conditions, the header length can be increased by repeating the payload header symbols a set number of times. The present invention provides four distinct possible header lengths, and in particular provides payload headers which can take on four possible integer multiples of k symbols. The number of total symbols in a particular payload header (i.e., the particular header length) is determined by the SNR of the communication frame 30 when received at the corresponding transceiver(s) 14. As will be discussed, the first transceiver 12 is able to encode information, pertaining to the received SNR, in the communication frame 30, which indicates to the receiving transceiver(s) 14 the received SNR operating range and the number of payload header symbols (i.e., the header length) necessary to receive the corresponding payload message symbols. Within the context of this document, the term "received SNR operating range" generally refers to the range of SNRs at which a signal can be received, which may be affected by transmitter and/or communication channel noise and/or impairments caused by, for example, atmospheric or weather-related disturbances.

Generally speaking, for lower received SNR operating ranges, a larger number of header symbols is necessary (required) by the transceiver(s) 14 to decode the payload message symbols, whereas for higher received SNR operating ranges, a smaller number of header symbols is necessary (required) by the transceiver(s) 14 to decode the payload message symbols. The encoding of the necessary number of payload header symbols allows the communication network 10 to operate under VLSNR conditions, for example, as low as $E_S/N_0$ of ~–10 dB.

It is noted that within the context of this document the term "decode", as used in the phrases "necessary to decode the corresponding payload message symbols", "required to decode the payload message symbols" and similar alternatives, generally refers to any or all of receiving, detecting, acquiring, and demodulating the signal corresponding to the payload message symbols, and subsequently decoding such payload message symbols (at the receiving transceiver) to retrieve the set(s) of bits according to which the payload message symbols were generated such that one or more desired performance criteria (e.g., bit-error-rate (BER), symbol-error-rate (SER), word-error-rate (WER), frame-error-rate (FER)) are satisfied for a given received SNR operating range. In this document, the performance criterion is quasi-error-free (QEF) performance in terms of WER of the payload header at the extreme values of the VLSNR range (e.g., a WER of $10^{-6}$ at $E_S/N_0$ of –10.4 dB).

For each received SNR operating range, a single block of k payload header symbols is manipulated according to a repetition factor R. The manipulation according to the repetition factor R yields repeating or puncturing the single block of k payload header symbols, depending on the SNR operating range. Within the context of this document, repetition of a block of k payload header symbols R times means that the total number of payload header symbols will be R*k payload header symbols. For example, repetition of a block of k payload header symbols one time (i.e., once) means that the total number of payload header symbols yielded by the single repetition will be k. The number of header symbols (i.e., the payload header length yielded by the repetition factor R), is determined according to the particular received SNR operating range. In the DVB-S2X standard, the repetition factor R can take on values of ½, 1, 2 or 5. When the repetition factor R is ½, i.e. when manipulation according to the repetition factor yields puncturing the single block of k payload header symbols, the single block of k payload header symbols is punctured according to a puncturing pattern, which may, for example, remove every symbol in an even position in the block of k payload header symbols, or remove every symbol in an odd position in the block of k payload header symbols. Other puncturing patterns are also contemplated, including, for example, removing the first k/2 symbols in the block of k payload header symbols, and removing the last k/2 symbols in the block of k payload header symbols.

The number of possible payload header lengths is $m=2^n$. In the DVB-S2X standard n=2 (i.e., m=4) and a single block of payload header symbols consists of 180 symbols (i.e., k=180). As such, the possible payload header lengths are as follows: a payload header length of 90 symbols obtained by puncturing the single block of 180 payload header symbols (i.e., R=½) according to a puncturing pattern, a payload header length of 180 symbols obtained by a single repetition of the single block of 180 payload header symbols (i.e., R=1), a payload header length of 360 symbols obtained by repeating the single block of 180 payload header symbols twice (i.e., R=2), or payload header length of 900 symbols obtained by repeating the single block of 180 payload header symbols five times (i.e., R=5).

With continued reference to FIG. 4, the preamble 40 of the communication frame 30 consists of two fields, i.e., two segments of symbols: a first segment, which indicates the beginning of the communication frame 30, and a second segment, which indicates the format of the ensuing symbols of the communication frame 30. Together, the two fields of the preamble 40 make up an integer multiple of K symbols. In the DVB-S2X standard, the first field is referred to as a start of superframe (SOSF) field of 270 symbols, and the second field is referred to as a superframe format indicator (SFFI) of 450 symbols, and the length of the preamble 40 is eight blocks of 90 symbols, i.e., 720 symbols. In this standard, the SOSF field symbols are generated from a 256-bit long Walsh-Hadamard sequence, plus 14-bit padding. Note that in this standard, other communication frame formats, suitable for communications under various other transmission conditions (for example pre-scheduled transmission conditions), are available, and the SFFI field indicates which specific type of communication frame format is to be used when transmitting the communication frames of a particular dwell 20.

The communication frame header 50 follows the preamble 40. The communication frame header 50 consists of two fields, i.e., two segments of symbols: a first segment of L-N symbols, which is used for synchronization purposes, and a second segment of N symbols. In the DVB-S2X standard, the first field is referred to as an extended header field (EHF) and consists of a segment of 504 symbols derived from the Walsh-Hadamard sequence used to generate the SOSF, and the second field is referred to as a protection level indicator (PLI) and consists of a segment of 216 symbols (i.e., N is 216, and L is 720). The segment of N symbols is a sequence of N (e.g., 216) symbols that carries n bits of information ($b_0 b_1 \ldots b_{n-1}$), that is specifically selected in order to encode the information, pertaining to the received SNR, which indicates to the receiving transceiver(s) 14 the number of payload header symbols (e.g., 90 symbols, 180 symbols, 360 symbols or 900 symbols) required to decode the corresponding payload message symbols of the communication frame 30. In the DVB-S2X standard, the sequence of N symbols carries two bits of information (i.e., n=2). The designated length of the payload header (e.g., 90 symbols, 180 symbols, 360 symbols or 900 symbols) incorporated into the second segment of N symbols, via the encoded SNR information, is determined according to the minimal SNR required by all of the transceivers 14 that are to receive the communication frame 30.

The sequence of N symbols in the communication frame header 50 is selected from $m=2^n$ possible sequences of N symbols which can be easily distinguished from each other. Each of the m sequences of N symbols is 1-to-1 mapped to a corresponding one of m distinct received SNR operating ranges, and by analogy is 1-to-1 mapped to a corresponding number of payload header symbols (i.e., payload header length) necessary for the transceiver(s) 14 to decode the corresponding payload message symbols. Table 1 below shows the mapping, used in the DVB-S2X standard, between the m=4 possible sequences of N symbols, the two information bits, the received SNR operating ranges, and the payload header length (i.e., number of payload header symbols). Also included in Table 1 is the multiplication factor, R, for each possible two-bit string $b_0 b_1$.

| Sequence | $b_0 b_1$ | SNR range | Payload Header Length (symbols) | R |
|---|---|---|---|---|
| $S_1$ | 10 | $-9.9$ dB $< E_S/N_0 < -7.5$ dB | 900 | 5 |
| $S_2$ | 01 | $-7.5$ dB $< E_S/N_0 < -5$ dB | 360 | 2 |
| $S_3$ | 00 | $-5$ dB $< E_S/N_0 < -1.8$ dB | 180 | 1 |
| $S_4$ | 11 | $-1.8$ dB $< E_S/N_0$ | 90 | ½ |

It is noted that the upper bound of each SNR range represents the minimal SNR at which the corresponding payload header can be detected with the given repetition factor R. In actual implementation, in order to ensure robust detection, the upper bounds may be increased by taking some threshold value above the upper bounds shown in Table 1.

Figure 5:
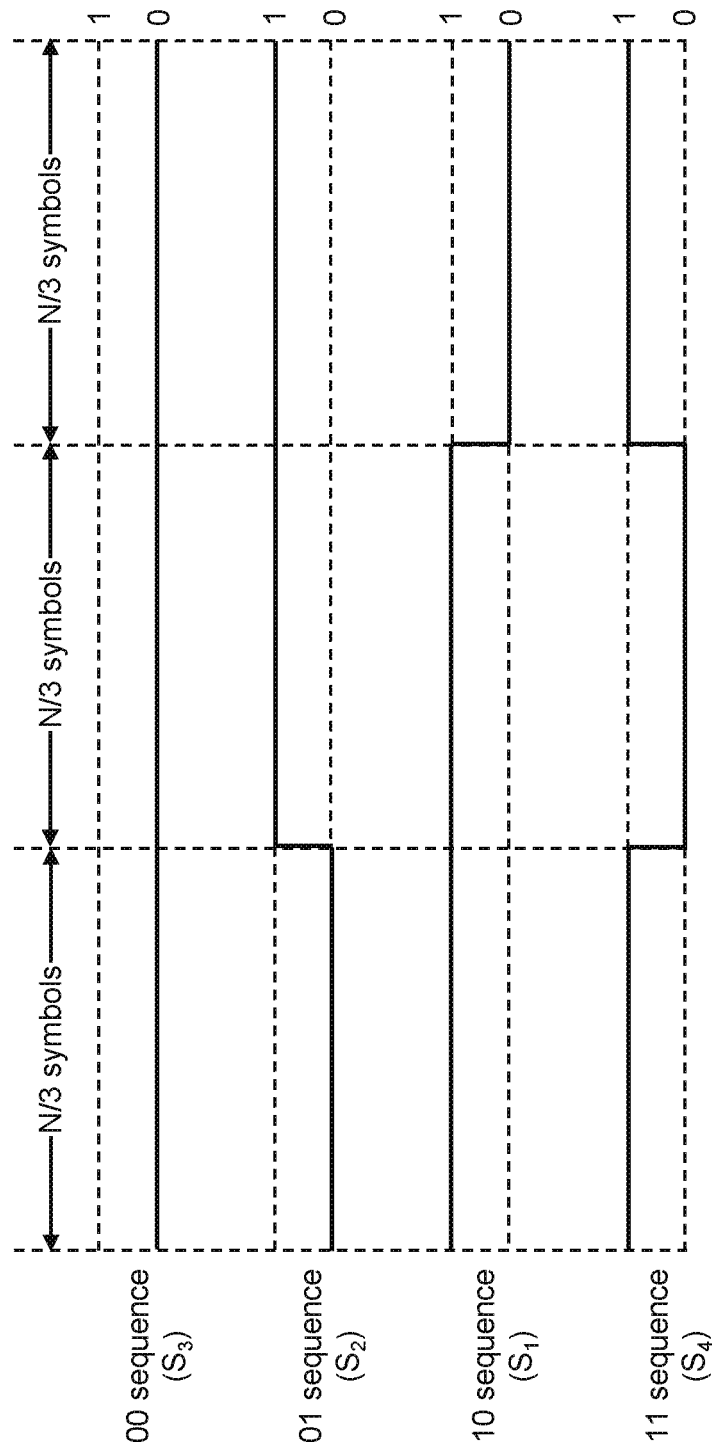
FIG. 5 is an exemplary set of sequences, a selected one of which can be included in a header of the communication frame of FIG. 4, according to an embodiment of the invention.

Refer now to FIG. 5, an example of four possible sequences of N symbols according to embodiments of the disclosed subject matter, that can be used in the DVB-S2X standard. The sequences of N symbols are binary sequences (i.e., each symbol in the sequence can take on a first or second symbol value selected from a binary symbol alphabet). In the example shown in FIG. 5, the binary symbol values are 0 and 1, however, symbol mapping, such as the mapping used in BPSK signaling, can also be used, thereby yielding binary symbol values of +1 and −1. The four possible sequences are designed such that they are easily distinguishable from each other—which is ideal when the sequences are received over a noisy communication medium. In a preferred embodiment, the four sequences are selected (i.e., designed) such that the minimum Hamming distance of the four possible sequence of length N is maximized, enabling optimal distinguishability between the four sequences. A proof of maximization of the minimum Hamming distance will be given in a subsequent section of the present disclosure.

A general, or basic, example of the four possible sequences is shown in FIG. 5. In this example, the first sequence $S_1$, corresponding to $b_0 b_1 = 10$ (i.e., a first received SNR operating range of $-9.9$ dB$<E_S/N_0<-7.5$ dB), is a sequence of 2N/3 (e.g., 144) ones followed by N/3 (e.g., 72) zeroes, the second sequence $S_2$, corresponding to $b_0 b_1 = 01$ (i.e., a second received SNR operating range of $-7.5$ dB$<E_S/N_0<-5$ dB), is a sequence of N/3 (e.g., 72) zeroes followed by 2N/3 (e.g., 144) ones, the third sequence $S_3$, corresponding to $b_0 b_1 = 00$ (i.e., a third received SNR operating range of $-5$ dB$<E_S/N_0<-1.8$ dB), is a sequence of N (e.g., 216) zeroes, and the fourth sequence $S_4$, corresponding to $b_0 b_1 = 11$ (i.e., a fourth received SNR operating range of $-1.8$ dB$<E_S/N_0$), is a sequence of N/3 (e.g., 72) ones followed by N/3 (e.g., 72) zeroes followed by N/3 (e.g., 72) ones.

Parenthetically, it is noted that in DVB standard committee discussions prior to the release of the DVB-S2X standard, other values of N were contemplated, specifically N=270, resulting in the EHF being formed of 450 symbols, and the PLI field being formed of 270 symbols. As should be apparent to those skilled in the art, the teachings of the present disclosure should not be limited to the strict case in which N=216, but are equally applicable to sequences for various values of N that are divisible by 3, including those in which N is less than 216, between 216 and 270, and greater than or equal to 270.

Figure 6:
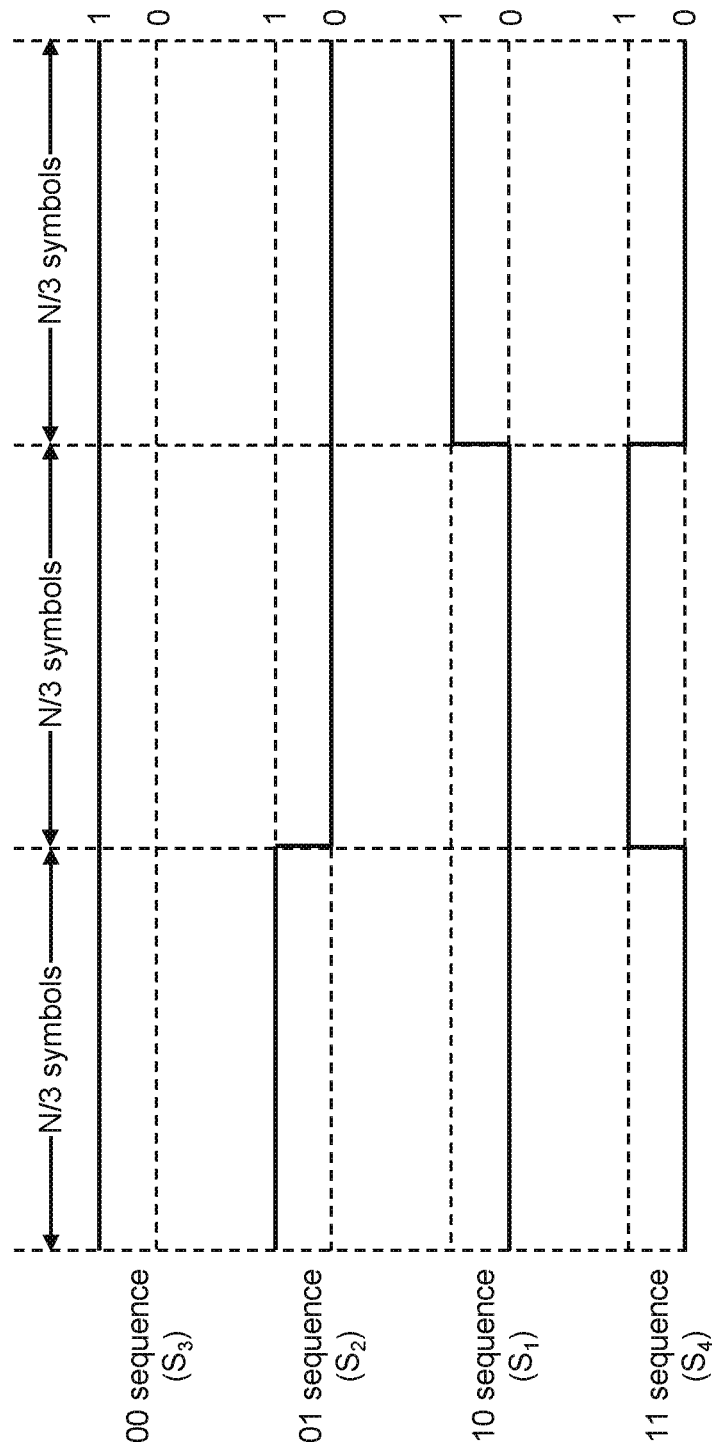
FIG. 6 is another exemplary set of sequences, a selected one of which can be included in a header of the communication frame of FIG. 4, according to an embodiment of the invention.

As mentioned above, the four sequences shown in FIG. 5 are merely examples of four sequences which achieve maximization of minimum Hamming distance. Other sequences which satisfy this Hamming distance criterion are also possible, and can be easily generated from the four sequences described above by applying a transform (or transforms) equally to each of the four exemplary sequences. For example, the symbols in each of the four exemplary sequences can be permuted according to the same permutation function, since Hamming distance is invariant with respect to permutation when the same permutation function is applied to all sequences. As another example, the four exemplary sequences may be scrambled according to the same scrambling function (i.e., XORed with the same arbitrary binary sequence of length N). One example of such a scrambling transformation is shown in FIG. 6, in which the four exemplary sequences of FIG. 5 are XORed with a sequence of N ones. The result is bit flipping each of the bits in the four exemplary sequences of FIG. 5, e.g., the first sequence in FIG. 5 would become a sequence of N ones in FIG. 6.

It is noted that the above example transformations are examples of linear operations, which can be combined in any order, and still satisfy the maximized minimum Hamming distance criterion. In other words, the four exemplary sequences can be permuted and then scrambled (by any arbitrary binary sequence of length N) or scrambled and then permuted.

The following is a proof that the maximal minimum Hamming distance that is achievable between each length N sequence from a set of four possible length N sequences is 2N/3.

Let $S_i$ be a set of binary sequences of length N, $s_i(n) \in \{0, 1\}$, $n=1, \ldots, N$; $i=1, \ldots, 4$. The Hamming distance between two sequences is defined as:

$$d_{ij} = \Sigma_{n=1}^{N}[s_i(n) \neq s_j(n)] = \Sigma_{n=1}^{N}|s_i(n) - s_j(n)|$$

where the notation "[logical expression]" equals 1 when the logical expression is true, and 0 otherwise.

Denote by $d_{min}$ the minimal distance between sequences in the set, thus:

$$d_{ij} \geq d_{min}$$

The goal is to find the maximal value of $d_{min}$ that can be achieved between any four binary sequences of length N.

Assume, without loss of generality that $s_1(n) = 0$ $\forall n$.

Thus, the sequence $s_2(n)$ that has at least $d_{min}$ "1" is at the minimum Hamming distance from $s_1(n)$. Assume that the vector that describes the location of those 1's in the sequence is $n_2$. Denote $\overline{n_2}$ as the set of indices for which $s_2(\overline{n_2}) = 0$.

Similarly, the sequence $s_3(n)$ is another sequence having a distance $d_{min}$ from $s_1(n)$, and it also contains at least $d_{min}$ 1's at locations $n_3$. $s_3(n_3) = 1$; $s_3(\overline{n_3}) = 0$.

The Hamming distance between $s_2$ and $s_3$ is given by:

$$d_{2,3} = |n_2 \cap \overline{n_3}| + |n_3 \cap \overline{n_2}| \leq 2(N - d_{min})$$

This expression can be better understood, if the locations of 1's in $s_2$ and $s_3$ are rearranged such that:

$$s_2(m) = 1, m = 1, \ldots, M, M \geq d_{min}$$

$$s_3(k) = 1, k = N - K + 1, \ldots, N, K \geq d_{min}$$

Following the requirement that the distance is greater than $d_{min}$ $$d_{2,3} = 2(N - d_{min}) \geq d_{min}$$

$$d_{min} = \frac{2N}{3}$$

As for the forth sequence, assume there are $a_1$ 1's are located at locations 1, ..., M, $a_2$ 1's in locations M, ... N−K, and $a_3$ 1's in locations N−K+1, ..., N.

$$d_{1,4}=a_1+a_2+a_3 \geq d_{min}$$

$$d_{2,4}=a_1+(M+K-N-a_2)+(N-M-a_3)$$

$$d_{3,4}=a_3+(M+K-N-a_2)+(N-M-a_1)$$

Simplifying and re-arranging the above expressions yields:

$$d_{1,4}=a_1+a_2+a_3 \geq d_{min}$$

$$d_{2,4}=a_1-a_2-a_3+K \geq d_{min}$$

$$d_{3,4}=a_3-a_2-a_1+K \geq d_{min}$$

Further re-arranging the above yields:

$$d_{1,4}=a_1+a_2+a_3 \geq d_{min}$$

$$d_{2,4}=a_1-a_2-a_3+K \geq a_1-a_2-a_3+d_{min} \geq d_{min}$$

$$d_{3,4}=a_3-a_2-a_1+K \geq a_3-a_2-a_1+d_{min} a_3-a_2-a_1+K \geq d_{min}$$

$$a_1+a_2+a_3 \geq d_{min}$$

$$a_1 \geq a_2+a_3$$

$$a_3 \geq a_2+a_1$$

The set holds when $$a_2 = 0, \ a_1 = a_3 \geq \frac{d_{min}}{2}$$

But it is also required that:

$$N - K \geq a_1$$

$$N - K \geq N - d_{min} \geq a_1 \geq \frac{d_{min}}{2}$$

Therefore, $$d_{min} \leq \frac{2N}{3}.$$

Figure 7:
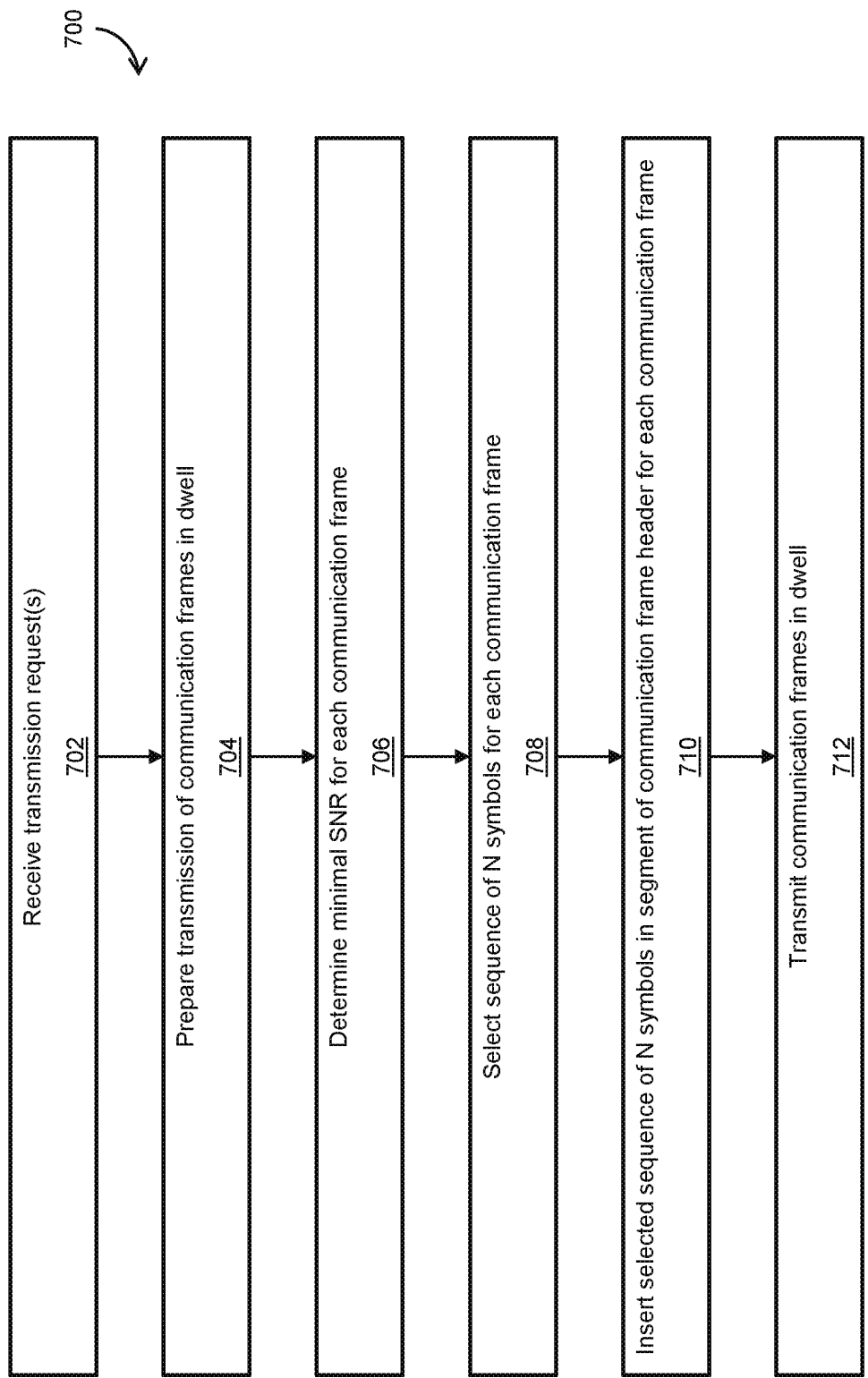
FIG. 7 is a flow diagram illustrating a process for transmitting from one transceiver to one or more other transceivers, according to an embodiment of the present invention.

Attention is now directed to FIG. 7, which shows a flow diagram detailing a process (i.e., method) 700 for transmitting from one transceiver to one or more other transceivers forming one or more communication links of a communication network (e.g., the communication network 10). Reference is also made to FIGS. 1-6. The process 700, and its sub-processes, are performed by the first transceiver 12 and its associated components. It is noted that prior to performing the steps associated with the process 700, the transceiver 12 may generate, or may be provided with (via data upload or uplink), the m possible sequences of length N (for example as described with reference to FIGS. 5 and 6) to be used for operation under VLSNR conditions.

The process 700 begins at step 702, where the first transceiver 12 receives a transmission request, for one or more of the second transceivers 14, to receive communication services. In response to the request, at step 704, the first transceiver 12 prepares a sequence of communication frames 30 for transmission to a group of the second transceivers 14 in a first dwell (i.e., first beam hop). At step 706, the transceiver determines, for each communication frame 30, the minimal SNR that the communication frame 30 will be received at by the group of corresponding transceivers 14. For example, if one of the transceivers 14 will receive a given communication frame 30 at an SNR of −2.5 dB and another one of the transceivers 14 will receive the same communication frame at an SNR of −5 dB, the first transceiver 12 determines that the minimal SNR for that communication frame 30 is −5 dB. Link analysis may be performed by the first transceiver 12 in order to determine (i.e., estimate, predict) the minimal SNR.

The process 700 then moves to step 708, where, for each communication frame of the dwell 20, the transceiver 12 selects one of the m sequences of N symbols to be included as the second segment of the communication frame header 50 of the communication frame 30. The selected sequence is selected according to the mapping between the m possible sequences of N symbols and the m distinct received SNR operating ranges. The particular received SNR operating range is determined according to the received SNR operating range in which the minimal SNR (determined in step 706) falls. Accordingly, for example, if the minimal SNR is determined to be −5 dB, the selected sequence (based on Table 1) would be $S_2$.

At step 710, the first transceiver 12 sets the N symbols in the second segment of the communication frame header 50 as the N symbols of the selected sequence of N symbols. This step is performed for each selected sequence (i.e., for each communication frame 30).

Finally, at step 712, the first transceiver 12 transmits the communication frames 30 as part of a dwell 20. As should be apparent, the steps in the process 700 may be repeated for each subsequent dwell.

Figure 8:
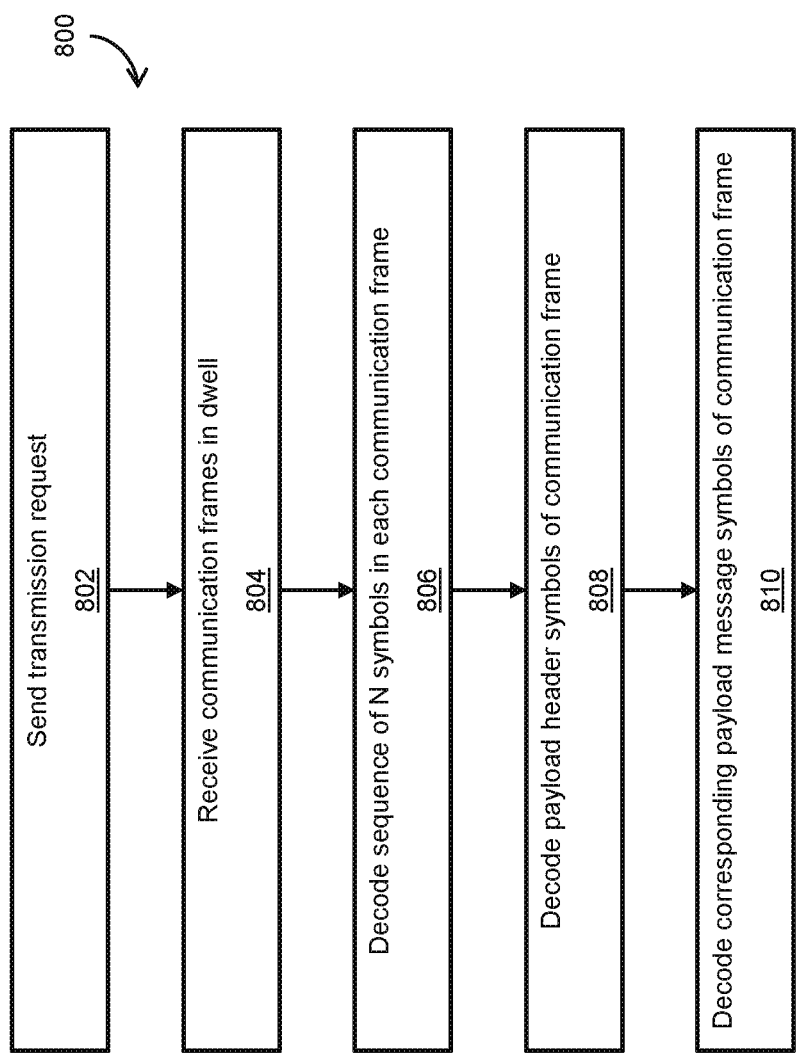
FIG. 8 is a flow diagram illustrating a process for receiving a transmission from a transmitting transceiver, according to an embodiment of the present invention.

Attention is now directed to FIG. 8, which shows a flow diagram detailing a process (i.e., method) 800 for receiving, at a particular receiving transceiver of one or more receiving transceivers, communications transmitted by a first transceiver. Reference is also made to FIGS. 1-7. The process 800, and its sub-processes, are performed by one or more of the second transceivers 14 and associated components therewith. It is noted that prior to performing the steps associated with the process 800, the transceiver(s) 14 are preferably provided with the mapping described in Table 1.

The process 800 begins at step 802, where a particular second transceiver 14 sends a transmission request to the first transceiver 12 to receive communication services. At step 804, the particular second transceiver 14 receives the communication frames 30 (in a dwell 20), at a received SNR, that are designated for the particular second transceiver 14.

At step 806, the particular second transceiver 14 decodes the sequence of N symbols in the communication frame header 50 (this is performed for each relevant communication frame 30). Since the transmitted sequence of N symbols is subjected to noise from the communication channel, the particular second transceiver 14 may perform thresholding of the received sequence of N noisy symbols in order to make a decision as to whether a particular symbol (i.e., the $k^{th}$ symbol in the sequence of N symbols) is a first symbol value (e.g., 0) or second symbol value (e.g., 1). The particular second transceiver 14 may also perform sequence detection (e.g., maximum likelihood sequence detection) to decode the received sequence of N noisy symbols. As a result, the particular second transceiver 14 generates a received sequence of N symbols (referred to as $S_R$). The decoding step 806 also includes deciding which of the m possible sequences of N symbols was transmitted by the first transceiver 12, by, for example, calculating the Hamming distance between $S_R$ and each of the m possible sequences of N symbols. The sequence that results in the minimum Hamming distance is then determined to be the transmitted sequence of N symbols. The decoding step 806 also includes de-mapping the determined sequence of N symbols to the corresponding n-bit string $b_0 b_1 \ldots b_{n-1}$.

The process 800 then moves to step 808, where the particular second transceiver 14 decodes (i.e., reads) the appropriate number of payload header symbols according to the mapping between the corresponding decoded n-bit string $b_0 b_1 \ldots b_{n-1}$ (and equivalently the transmitted sequence of N symbols) and payload header length. For example, referring again to Table 1, if the decoded sequence resultant from step 806 is the first sequence $S_1$, the particular second transceiver 14 will read the particular block of payload header symbols five times (i.e., repetition factor R=5, a payload header length of 180*5=900 symbols). The process 800 then moves to step 810, where the particular second transceiver 14 receives the corresponding payload message symbols of the communication frame 30, enabled by the decoding of the necessary payload header symbols in step 808.

This process 800 is repeated by the particular second transceiver 14 for each relevant communication frame in the given dwell 20, and is similarly performed by each of the second transceivers that is transmitted to by the first transceiver 12 in the dwell 20.

Figure 9:
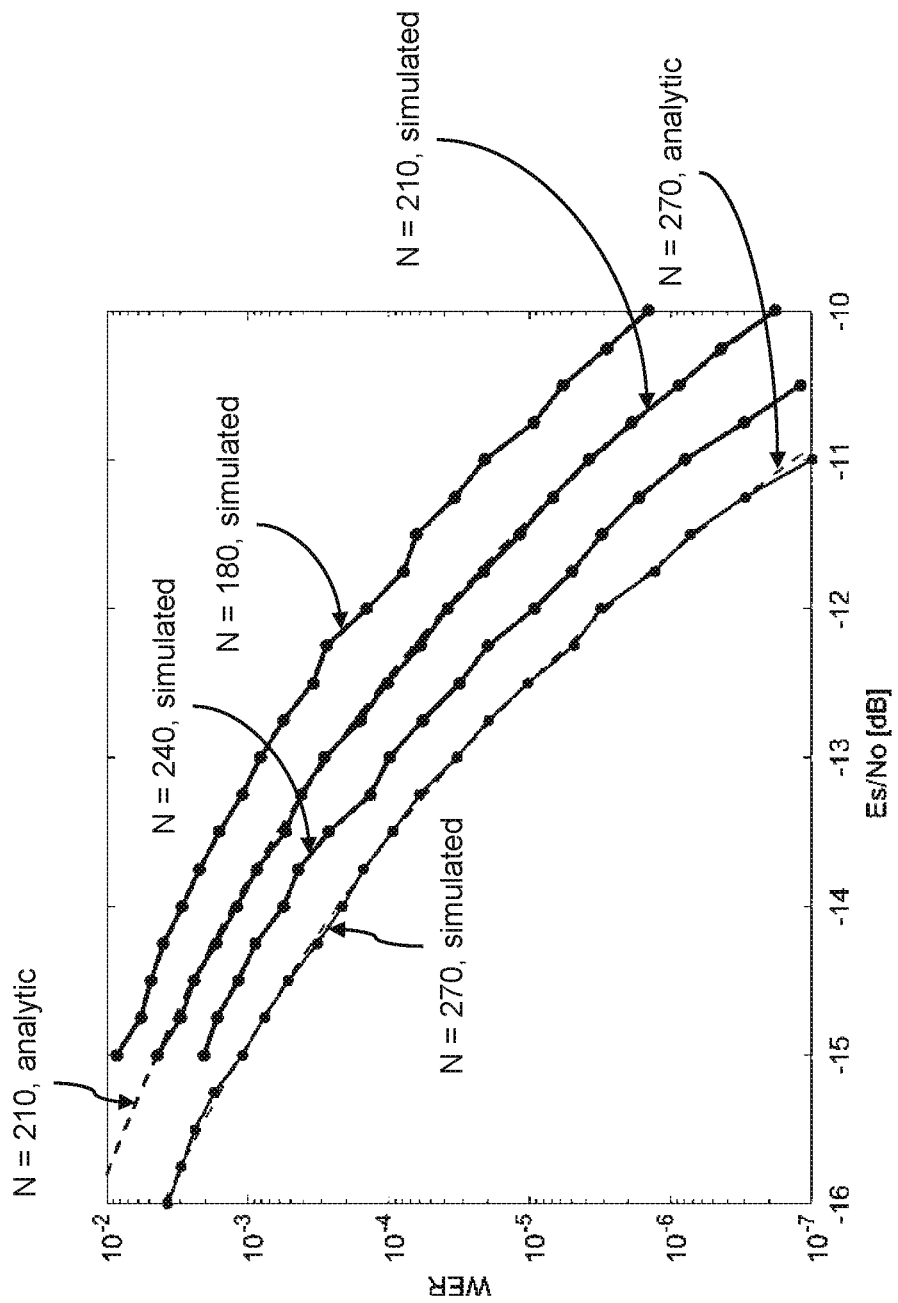
FIG. 9 illustrates graphs of error performance that is achievable when using the communication methodology of the present invention.

FIG. 9 shows simulation results of the WER rate that is achievable using the communication methodology according to embodiments of the disclosed subject matter. The WER is plotted as a function of $E_S/N_0$ for various values of N. Also shown in FIG. 9 are analytic (i.e., theoretical) results for values of N=210 and N=270. The analytic results are based on the following equation:

$$WER = 3Q\left(\sqrt{\frac{2E_S}{N_0} \frac{2N}{3}}\right)$$

where the expression Q(x) is the Q-function, and is defined as:

$$Q(x) = \frac{1}{\sqrt{2\pi}} \int_0^\infty e^{-\frac{u^2}{2}} du$$

As can be seen from FIG. 9, the simulated and analytic results are nearly identical for the cases of N=210 and N=270.

FIGS. 10 and 11 illustrate simplified block diagrams of the first transceiver 12 and the second transceiver(s) 14, respectively, according to a non-limiting implementation of the present disclosure. As noted at the beginning of this document, the transceivers 12, 14 may include a variety of components used to perform tasks that are part of transmission and/or reception functionality of the transceivers, some of which additional components are not illustrated in FIGS. 10 and 11.

Referring first to FIG. 10, the input stream interface 102 receives a data (bit) stream 100, which is in the form of a sequence of packets, for example, MPEG packets. The input stream interface 102 may provide the data stream 100 to a communication mode adapter and/or a stream adapter (not shown). The bits in the packets are encapsulated by FEC encoder 104, symbol mapper 106, and physical layer framer 108. The blocks may perform the communication frame encapsulation described in previous sections of this document.

The FEC encoder 104 may include concatenation of different error-correcting codes. For example, the FEC encoder 104 may include an outer code, such as a Bose-Chaudhuri-Hocquenghem (BCH) code or Reed-Solomon (RS) code, and an inner code, such as convolutional code, a low-density parity-check (LDPC) code or other Turbo-like code (e.g., a serial concatenated convolutional code (SCCC) or parallel concatenated convolutional code (PCCC)). In the DVB-S2X standard, the outer code is implemented as a BCH code and the inner code is implemented as an LDPC code. The FEC encoder 104 may also include a bit interleaver. The FEC encoded bits are then mapped to modulation constellation symbols by symbol mapper 106. Various modulation constellations are possible, including, but not limited to, binary phase-shift keying (BPSK), BPSK with a spreading factor, e.g., factor of two (BPSK-S), quadrature phase-shift keying (QPSK), 8PSK, 16 quadrature-amplitude modulation (16QAM), 16 amplitude and phase-shift keying (16APSK), 32QAM, 32APSK, 64QAM, 64APSK, 128APSK, and 256APSK. The mapped symbols are then framed by the physical layer framer 108 to form the communication frames. The communication frame symbols are then modulated, by modulator 110, and are physically transmitted, as waveform signals, by RF transmitter 112. The transmitted signals are sent as downlink transmissions to the transceiver 14.

At the transceiver(s) 14, the downlink signal is received at RF front end (RFE) 114 (which may include a tuner and ADC). The signal from the RFE 114 is demodulated by demodulator 116 to produce demodulated symbols. Various sub-blocks that perform various functions, including, but not limited to, automatic gain control, I/Q balancing, timing recovery, equalization, and phase recovery (via phase-lock loops), can be included as part of the RFE 114 or demodulator 116, or as separate blocks between the RFE 114 and the demodulator 116.

The demodulated symbols are de-mapped to bits by demapper 118. FEC decoder 120 performs functions to decode the FEC encoded bits to produce output data stream 122, which may be, for example, a sequence of MPEG packets. The FEC decoder 120 uses appropriate decoding algorithms (e.g., Viterbi algorithm, Bahl, Cocke, Jelinek and Raviv (BCJR) algorithm, Berlekamp-Massey algorithm, etc.) to decode the FEC encoded bits. When the bits at the transceiver 12 side are interleaved by the FEC encoder 104, the FEC decoder 120 may also include a bit deinterleaver to deinterleave the interleaved bits prior to performing the specific FEC decoding algorithms.

The embodiments of the present disclosure, when used in satellite communication networks, and in particular when used in communication networks comprised of transceivers that exchange communication according to the DVB-S2X standard, enable transmission at spectral efficiencies (bits per symbol or bits per hertz—Hz) that approach the Shannon limit for various MODCODs, even when operating under VLSNR conditions. Table 2 below shows the spectral efficiencies that are achievable for a sampling of the MODCODs at various required SNR values that can be used in the DVB-S2X standard. The last six entries in Table 2 are for low SNR conditions, including VLSNR.

| Modulation | Code Rate | Spectral Efficiency (bits/symbol) | Spectral Efficiency (bits/Hz) | Required $E_S/N_0$ | Required C/N |
|---|---|---|---|---|---|
| QPSK | 1/4 | .4927 | .41059 | −2.35 | −1.56 |
| QPSK | 2/5 | .7919 | .6599 | −0.3 | .49 |
| QPSK | 5/6 | 1.6571 | 1.38094 | 5.18 | 5.97 |
| QPSK | 8/9 | 1.7689 | 1.47409 | 6.2 | 6.99 |
| 8PSK | 3/5 | 1.7837 | 1.4864 | 5.5 | 6.29 |
| 8PSK | 5/6 | 2.4822 | 2.06854 | 9.35 | 10.14 |
| 8PSK | 9/10 | 2.6829 | 2.23575 | 10.98 | 11.77 |
| 16APSK | 2/3 | 2.6421 | 2.20176 | 8.97 | 9.76 |
| 16APSK | 5/6 | 3.3051 | 2.75425 | 11.61 | 12.4 |
| 32APSK | 3/4 | 3.7094 | 3.09119 | 12.73 | 13.52 |
| 32APSK | 5/6 | 4.1257 | 3.43806 | 14.28 | 15.07 |
| 32APSK | 8/9 | 4.404 | 3.66999 | 15.69 | 16.48 |
| 128APSK | 3/4 | 5.1784 | 4.31536 | 17.73 | 18.52 |
| 128APSK | 7/9 | 5.2497 | 4.37474 | 18.53 | 19.32 |
| 256APSK | 32/45 | 5.6029 | 4.66911 | 18.59 | 19.38 |
| QPSK | 2/9 | 0.4269 | .35575 | −2.85 | −2.06 |
| BPSK | 1/5 | 0.1701 | 0.14172 | −6.85 | −6.06 |
| BPSK | 11/45 | 0.2326 | 0.1938 | −5.5 | −4.71 |
| BPSK | 1/3 | 0.3191 | 0.26591 | −4 | −3.21 |
| BPSK-S | 1/5 | 0.0755 | 0.0629 | −9.9 | −9.11 |
| BPSK-S | 11/45 | 0.1139 | 0.09495 | −8.3 | −7.51 |

Although the embodiments of the present disclosure have been described within the context of satellite communication networks, the solution provided by the embodiments of the present disclosure are suitable for any communication link part of a communication network that operates under a wide range of SNR conditions down to VLSNR conditions, including, but not limited to, wireless communication networks and cellular communication networks.

Implementation of the methods and/or devices and/or systems of embodiments of the invention can involve performing or completing selected tasks implemented by hardware, by software or by firmware or by a combination thereof. For example, hardware for performing selected tasks according to embodiments of the invention could be implemented as a chip or a circuit. As software, selected tasks according to embodiments of the invention could be implemented as a plurality of software instructions being executed by a computer using any suitable operating system. In certain embodiments of the invention, one or more tasks according to exemplary embodiments of methods and/or devices and/or systems as described herein are performed by a computerized data processor that can execute a plurality of instructions. Optionally, the data processor includes a volatile memory for storing instructions and/or data and/or a non-volatile storage, for example, non-transitory storage media such as a magnetic hard-disk and/or removable media, for storing instructions and/or data.

For example, any combination of one or more non-transitory computer readable (storage) medium(s) may be utilized in accordance with the above-listed embodiments of the present invention. The non-transitory computer readable (storage) medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

As will be understood with reference to the paragraphs and the referenced drawings, provided above, various embodiments of machine-implemented methods are provided herein, some of which can be performed by various embodiments of apparatuses and systems described herein and some of which can be performed according to instructions stored in non-transitory computer-readable storage media described herein. Still, some embodiments of machine-implemented methods provided herein can be performed by other apparatuses or systems and can be performed according to instructions stored in computer-readable storage media other than that described herein, as will become apparent to those having skill in the art with reference to the embodiments described herein. Any reference to systems and computer-readable storage media with respect to the following machine-implemented methods is provided for explanatory purposes, and is not intended to limit any of such systems and any of such non-transitory computer-readable storage media with regard to embodiments of computer-implemented methods described above. Likewise, any reference to the following machine-implemented methods with respect to systems and computer-readable storage media is provided for explanatory purposes, and is not intended to limit any of such computer-implemented methods disclosed herein.

The flowcharts and block diagrams in the Figures illustrate the architecture, functionality, and operation of possible implementations of methods and/or devices and/or system according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, the singular form "a", "an" and "the" include plural references unless the context clearly dictates otherwise.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

The above-described processes including portions thereof can be performed by software, hardware and combinations thereof. These processes and portions thereof can be performed by processors, signal processors, micro-processors, and memory and other non-transitory storage-type devices associated therewith. The processes and portions thereof can also be embodied in programmable non-transitory storage media, for example, compact discs (CDs) or other discs including magnetic, optical, etc., readable by a machine or the like, or other computer usable storage media, including magnetic, optical, or semiconductor storage, or other source of electronic signals.

The processes (methods) and systems, including components thereof, herein have been described with exemplary reference to specific hardware and software. The processes (methods) have been described as exemplary, whereby specific steps and their order can be omitted and/or changed by persons of ordinary skill in the art to reduce these embodiments to practice without undue experimentation. The processes (methods) and systems have been described in a manner sufficient to enable persons of ordinary skill in the art to readily adapt other hardware and software as may be needed to reduce any of the embodiments to practice without undue experimentation and using conventional techniques.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for communicating in one or more links of a communication network, the method comprising:
transmitting a communication frame comprising a binary sequence of N symbols, ensuing payload header symbols, and ensuing payload message symbols, the binary sequence of N symbols encoding information in accordance with signal-to-noise ratio (SNR) associated with the communication frame, and wherein the binary sequence of N symbols is selected from a set of four binary sequences of length N, and wherein the set of four-binary sequences of length N is chosen from all possible sets of four binary sequences of length N such that the minimum Hamming distance of the set of four binary sequences of length N is maximized, wherein the communication frame includes a superframe header consisting of L symbols that consists of a first segment of L-N symbols and a second segment that consists of the binary sequence of N symbols, and wherein the encoded information is included in the second segment of symbols, and wherein L is 720 and N is 216.

2. The method of claim 1, wherein the encoded information is indicative of a number of the payload header symbols necessary to decode a corresponding number of the payload message symbols.

3. The method of claim 1, wherein the one or more links includes at least one transceiver implemented as part of a satellite.

4. The method of claim 1, wherein the encoded information includes a mapping of a plurality of SNR ranges to a corresponding number of payload header symbols.

5. The method of claim 4, wherein the plurality of SNR ranges includes exactly four SNR ranges, and wherein a first SNR range of the plurality of SNR ranges is mapped to a first number of payload header symbols obtained by repeating a block of payload header symbols five times, and wherein a second SNR range of the plurality of SNR ranges is mapped to a second number of payload header symbols obtained by repeating the block of payload header symbols twice, and wherein a third SNR range of the plurality of SNR ranges is mapped to a third number of payload header symbols obtained by repeating the block of payload header symbols once, and wherein a fourth SNR range of the plurality of SNR ranges is mapped to a fourth number of payload header symbols obtained by puncturing the block of payload header symbols.

6. The method of claim 1, wherein the information encoded in the binary sequence of N symbols consists of two bits of information.

7. The method of claim 1, wherein the symbols for each sequence of the set of four binary sequences are selected from a binary symbol alphabet consisting of a first symbol value and a second symbol value, and wherein the set of four binary sequences are derived from: a first sequence consisting of N symbols of the first symbol value, a second sequence consisting of N/3 symbols of the first symbol value followed by 2N/3 symbols of the second symbol value, a third sequence consisting of 2N/3 symbols of the second symbol value followed by N/3 symbols of the first symbol value, and a fourth sequence consisting of N/3 symbols of the second symbol value followed by N/3 symbols of the first symbol value followed by N/3 symbols of the second symbol value.

8. The method of claim 1, further comprising: generating the set of four binary sequences of length N.

9. The method of claim 8, wherein the generating includes applying a transform to each sequence of the set of four binary sequences of length N, wherein the same transform is applied to each sequence of the set of four binary sequences of length N, and wherein the transform includes one or more of: permutation, and exclusive-or with a binary sequence of length N.

10. The method of claim 1, wherein the communication frame is a superframe compliant with Digital Video Broadcasting—Satellite—Second Generation Extensions (DVB-S2X) standard.

11. The method of claim 1, wherein the minimum Hamming distance of the set of four binary sequences of length N is equal to 2N/3.

12. A communication system comprising:
a transceiver configured to transmit a communication frame comprising a binary sequence of N symbols, ensuing payload header symbols, and ensuing payload message symbols, wherein the binary sequence of N symbols encodes information in accordance with signal-to-noise ratio (SNR) associated with the communication frame, and wherein the binary sequence of N symbols is selected from a set of four binary sequences of length N, and wherein the set of four binary sequences of length N is chosen from all possible sets of four binary sequences of length N such that the minimum Hamming distance of the set of four binary sequences of length N is maximized, wherein the communication frame includes a superframe header consisting of L symbols that consists of a first segment of L-N symbols and a second segment that consists of the binary sequence of N symbols, and where in the encoded information is included in the second segment of symbols, and wherein L is 720 and N is 216.

13. The communication system of claim 12, wherein the encoded information is indicative of a number of the payload header symbols necessary to decode a corresponding number of the payload message symbols.

14. The communication system of claim 12, wherein the transceiver is implemented in a satellite.

15. A method for communicating in one or more links of a communication network, the method comprising:
transmitting a communication frame that comprises a header including a binary sequence of N symbols, and one or more ensuing communication sub-frames, each communication sub-frame including a plurality of repeated blocks of payload header symbols followed by blocks of payload message symbols, wherein the binary sequence of N symbols encodes information in accordance with signal-to-noise ratio (SNR) associated with the communication frame and is indicative of a repetition factor to be applied to the blocks of payload header symbols, in each communication sub-frame, necessary to decode a corresponding number of the blocks of the payload message symbols, and wherein the binary sequence of N symbols is selected from a set of four binary sequences of length N, and wherein the set of four binary sequences of length N is chosen from all possible sets of four binary sequences of length N such that the minimum Hamming distance of the set of four binary sequences of length N is maximized, wherein the communication frame includes a superframe header consisting of L symbols that consists of a first segment of L-N symbols and a second segment that consists of the binary sequence of N symbols, and wherein the encoded information is included in the second segment of symbols, and wherein L is 720 and N is 216.

16. A method for communicating in one or more links of a communication network, the method comprising:
receiving a communication frame comprising a binary sequence of N symbols, ensuing payload header symbols, and ensuing payload message symbols, wherein the binary sequence of N symbols encodes information in accordance with signal-to-noise ratio (SNR) associated with the communication frame, and wherein the binary sequence of N symbols is selected from a set of four binary sequences of length N, and wherein the set of four binary sequences of length N is chosen from all possible sets of four binary sequences of length N such that the minimum Hamming distance of the set of four binary sequences of length N is maximized, wherein the communication frame includes a superframe header consisting of L symbols that consists of a first segment of L-N symbols and a second segment that consists of the binary sequence of N symbols, and wherein the encoded information is included in the second segment of symbols, and wherein L is 720 and N is 216.

17. The method of claim 16, wherein the encoded information is indicative of a number of the payload header symbols necessary to decode a corresponding number of the payload message symbols.

* * * * *